(12) United States Patent
Eldridge et al.

(10) Patent No.: US 11,421,320 B2
(45) Date of Patent: Aug. 23, 2022

(54) CHEMICAL DELIVERY SYSTEM AND METHOD OF OPERATING THE CHEMICAL DELIVERY SYSTEM

(71) Applicant: ENTEGRIS, INC., Billerica, MA (US)

(72) Inventors: David James Eldridge, Liberty Hill, TX (US); David Peters, Kingsland, TX (US); Robert Wright, Jr., Newtown, CT (US); Bryan C. Hendrix, Danbury, CT (US); Scott L. Battle, Cedar Park, TX (US); John Gregg, Marble Falls, TX (US)

(73) Assignee: ENTEGRIS, INC., Billerica, MA (US)

( * ) Notice: Subject to any disclaimer, the term of this patent is extended or adjusted under 35 U.S.C. 154(b) by 897 days.

(21) Appl. No.: 16/210,244

(22) Filed: Dec. 5, 2018

(65) Prior Publication Data

US 2019/0177840 A1 Jun. 13, 2019

Related U.S. Application Data

(60) Provisional application No. 62/595,740, filed on Dec. 7, 2017.

(51) Int. Cl.
| | | |
|---|---|---|
| *C23C 16/40* | (2006.01) | |
| *C23C 16/448* | (2006.01) | |
| *C23C 16/52* | (2006.01) | |
| *C23C 16/455* | (2006.01) | |

(52) U.S. Cl.
CPC .... *C23C 16/4487* (2013.01); *C23C 16/45512* (2013.01); *C23C 16/45523* (2013.01); *C23C 16/45525* (2013.01); *C23C 16/45561* (2013.01); *C23C 16/52* (2013.01)

(58) Field of Classification Search
CPC ..... C23C 14/24; C23C 14/243; C23C 14/246; C23C 14/26; C23C 14/28; C23C 16/448; C23C 16/4481; C23C 16/4482; C23C 16/4485; C23C 16/4487; C23C 16/45512; C23C 16/45523; C23C 16/45525;
(Continued)

(56) References Cited

U.S. PATENT DOCUMENTS

| | | |
|---|---|---|
| 10,480,071 B2 | 11/2019 | Maruya |
| 10,501,847 B2 | 12/2019 | Long |
| 2005/0115505 A1 | 6/2005 | Sandhu |

(Continued)

FOREIGN PATENT DOCUMENTS

| | | |
|---|---|---|
| CN | 106103795 A | 11/2016 |
| JP | 2016084517 A | 5/2016 |

(Continued)

*Primary Examiner* — Rudy Zervigon
(74) *Attorney, Agent, or Firm* — Entegris, Inc.

(57) ABSTRACT

A chemical delivery system includes a bulk container, a run/refill chamber, a first conduit and a second conduit. The bulk container stores a precursor. The run/refill chamber includes a plurality of spaced tubes having a plurality of surfaces for receiving the precursor in vapor form and storing the precursor in solid form. The first conduit connects the bulk container to the run/refill chamber for transporting the precursor from the bulk container to the run/refill chamber in vapor form. The second conduit connects the run/refill chamber to a deposition chamber for transporting the precursor from the run/refill chamber to the deposition chamber in vapor form.

6 Claims, 5 Drawing Sheets

(58) Field of Classification Search
CPC .............. C23C 16/45561; C23C 16/52; H01L 21/02271; H01L 21/67017
USPC ..................................... 118/726; 156/345.37
See application file for complete search history.

(56) References Cited

U.S. PATENT DOCUMENTS

| | | |
|---|---|---|
| 2005/0166847 A1 | 8/2005 | Derderian |
| 2010/0136772 A1* | 6/2010 | Oosterlaken ........ C23C 16/4481 438/503 |
| 2016/0017489 A1* | 1/2016 | Koller ..................... B01D 1/14 261/128 |

FOREIGN PATENT DOCUMENTS

| | | |
|---|---|---|
| WO | 2010038972 A3 | 4/2010 |
| WO | 2017198401 A1 | 11/2017 |

\* cited by examiner

CHEMICAL DELIVERY SYSTEM AND METHOD OF OPERATING THE CHEMICAL DELIVERY SYSTEM

CROSS-REFERENCE TO RELATED APPLICATIONS

This application claims the benefit under 35 USC 119 of U.S. Provisional Patent Application No. 62/595,740, filed Dec. 7, 2017, the disclosure of which is hereby incorporated herein by reference in its entirety for all purposes.

TECHNICAL FIELD

The disclosure relates generally to a chemical delivery system, particularly a chemical delivery system for use in a chemical vapor deposition process.

BACKGROUND

Chemical vapor deposition (CVD) is a chemical process used to deposit thin films of material on a substrate. Often, for example, in the semiconductor industry, a film is deposited on a silicon wafer. During the process, the wafer is exposed to one or more precursors that react or decompose and are thus deposited on the wafer in a deposition chamber. A more specific subclass of CVD is atomic layer deposition (ALD). In ALD, typically two precursors are used and are deposited on the wafer in an alternating manner. The precursors are never both present in the deposition chamber at the same time. A precursor for use in a CVD process can be stored in gaseous, liquid or solid form. The use of a solid precursor is especially challenging in terms of sublimating and subsequently transporting the precursor vapor to the substrate. Other more general concerns when designing a CVD system include a desire to minimize downtime of the system and the limited space available near the process tool that applies the precursor. Accordingly, it is desirable to provide a chemical delivery system that addresses these challenges. Specifically, it is desirable to provide a chemical delivery system that efficiently, effectively and consistently delivers a solid precursor in a CVD process while minimizing downtime of the CVD system and the amount of space taken up near the process tool.

SUMMARY

The present disclosure relates generally to a method of operating a chemical delivery system for delivering precursors during a CVD process. The system comprises at least one bulk container, at least one run/refill chamber, and at least one deposition chamber. In some embodiments, the method comprises a first conduit and a second conduit. The bulk container is configured to store a precursor, preferably in solid form. The run/refill chambers may be used alternatingly. In one embodiment, the run/refill chamber includes a plurality of spaced tubes having a plurality of surfaces configured to receive the precursor in vapor form and store the precursor in solid form. The first conduit connects the bulk container to the run/refill chamber for transporting the precursor from the bulk container to the run/refill chamber in vapor form. The second conduit is for transporting the precursor from the run/refill container to a deposition chamber in vapor form.

The bulk container is configured to store the precursor in solid form. The bulk container has high surface area and is preferably on scales to monitor the amount of precursor remaining during operation. The bulk container is preferably located in a subfab area where it is convenient to replace the container.

The chemical delivery system is configured to heat the bulk container to sublimate the precursor thus converting the precursor into vapor form. The chemical delivery system is also configured to heat the first conduit to maintain the precursor in vapor form.

In one embodiment, the run/refill chamber is located on a fabrication floor area commonly referred to as a "fab", and the bulk container is located outside the fab. For example, the bulk container can be located in a sub-fabrication area.

In one illustrative embodiment, each of the plurality of spaced tubes has a circular or rectangular cross section. In other embodiments, each of the plurality of spaced tubes has a star-shaped cross section. Preferably, each of the plurality of spaced tubes is filled with a foam. In some embodiments, the plurality of spaced tubes is surrounded by a chamber configured to receive a heat transfer fluid.

The run/refill chamber can be configured to hold an amount of the precursor sufficient for a single deposition cycle. Alternatively, the run/refill chamber can be configured to hold an amount of the precursor sufficient for a plurality of deposition cycles.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

Figure 1:
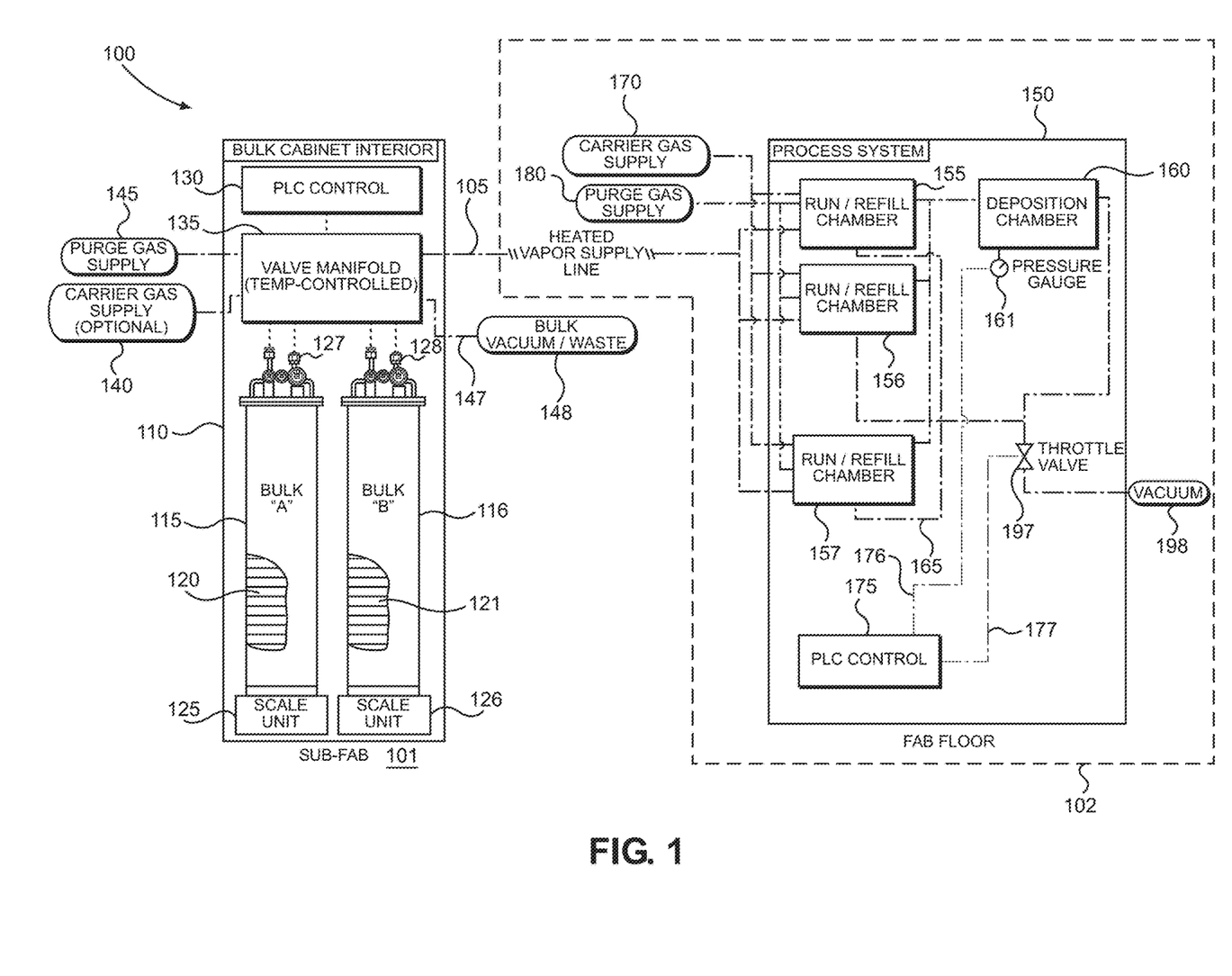
FIG. 1 is a schematic view of a first CVD system constructed in accordance with the present invention.

With initial reference to FIG. 1, there is shown a CVD system 100 constructed in accordance with the present invention. One portion of system 100 is located in a sub-fabrication area 101, hereinafter a sub-fab, while another portion is located in a fabrication area or floor 102 which is shown as enclosed by a dashed line, hereinafter a fab. These portions are connected by a heated vapor supply line (or first conduit) 105. A bulk cabinet 110 is preferably located in the sub-fab but could be located in a more remote location. Bulk cabinet 110 houses a first bulk container 115 and a second bulk container 116. Preferably, bulk containers 115 and 116 and their internal support structures are made of 316L stainless steel that is electro-polished. The 316L stainless steel is preferably coated with a thin film of a more resistant material for each specific chemistry, e.g., nickel, aluminum oxide, etc. Alternately, a metal alloy material can be employed. Inconel, Hastelloy C276, C22, Alloy 20, etc. are examples of such alloys. Also, different materials can be employed. For example, the bulk containers can be made of 316L stainless steel, and the internal support structure can be made of a more resistant alloy or coated with a more resistant alloy.

A precursor 120 is stored within bulk container 115 in solid form, and a precursor 121 is stored within bulk container 116 in solid form. Although different reference numerals are used, precursors 120 and 121 are typically the same material. In use, bulk container 115, for example, is used until precursor 120 is depleted. Then, bulk container 116 is used while bulk container 115 is being replaced or refilled. After precursor 121 is depleted, bulk container 115 is used while bulk container 116 is being replaced or refilled. Accordingly, there is no downtime in this portion of the process. A first scale unit 125 and a second scale unit 126 are configured to weigh bulk containers 115 and 116 to provide information regarding the amount of precursor 120 remaining within bulk container 115 and the amount of precursor 121 remaining within bulk container 116. Connection lines 127 and 128 allow for the precursor vapor to leave bulk containers 115 and 116. Bulk containers 115 and 116 can also employ additional monitoring features to monitor multiple temperature zones, vacuum level, mass flux rate to first conduit 105, internal/external filtration, internal/external purification, impurity levels, etc. A programmable logic controller 130 controls a manifold 135 to regulate the transport of precursors 120 and 121 from bulk containers 115 and 116 to the fab. Specifically, precursors 120 and 121 are heated in bulk containers 115 and 116 to cause sublimation and the resulting vapor is transported to fab 102 via vapor supply line 105, optionally using a carrier gas supplied by a carrier gas supply 140. Preferably, the temperature of the precursor is in the range of 80 to 250 degrees Celsius. Supply line 105 is preferably also heated at or above the temperature of the precursor in bulk containers 115 or 116 and monitored to measure precursor delivery rate. Precursors 120 and 121 are not typically transported through vapor supply line 105 at the same time. Instead, precursors 120 and 121 are preferably transported in an alternating fashion, as discussed above. A purge gas supplied by a purge gas supply 145 is used to purge the conduits through which precursors 120 and 121 pass (e.g., vapor supply line 105). The purge is preferably conducted with an automated cycle to remove potential chemical material from line 105 as it leaves bulk containers 115 and 116 through connectors that are not separately labeled. Waste is removed from manifold 135 through a line 147 to a vacuum disposal unit 148. Line 147 can also be heated to limit condensation of waste product. As an alternative delivery method, bulk containers 115 and 116 could be used in series or parallel with the proper manifolding. The manifolding would still allow a single container to provide vapor to the run/refill chambers while the other bulk container is replaced. The option of series or parallel delivery would allow for more complete consumption of the precursor while not impacting the quantity of vapor available to the run/refill chambers. This alternative would reduce the amount of residual precursor in the bulk container and would improve the cost of ownership.

A process system 150 is located in fab 102. Process system 150 includes a plurality of run/refill chambers 155-157, which receive precursors 120 and 121 from vapor supply line 105. In particular, precursors 120 and 121 enter run/refill chambers 155-157 as a vapor and are then deposited within run/refill chambers 155-157 as a solid by cooling run/refill chambers 155-157. For purposes of the present invention, the term "deposition", and variants thereof, refers to the chemical vapor deposition (CVD) process whereby a precursor gas is chemically converted to a solid film rather than the more general act of putting an object in specific location. Precursors 120 and 121 are stored within run/refill chambers 155-157 in solid form. When needed, precursor 120, 121 is sublimated within one of run/refill chambers 155-157 by heating the corresponding run/refill chamber 155-157. The run refill chambers 155-157 are preferably heated and cooled rapidly between a run mode to the chamber and a refill mode to condense solids. Heating and cooling is preferably accomplished using one of several techniques including resistive heating, hot oil recirculation and radiant heating. Cooling can be done by chilled water, glycol, heat transfer fluid, a Peltier cooling device, Joule-Thompson cooling, etc. Precursor 120, 121 is then transported to a deposition chamber 160, which is preferably in close proximity to run/refill chambers 155-157 and includes a pressure gauge 161. Alternatively, precursor 120, 121 is transported to a second run/refill chamber 155-157. A conduit 165 connects chambers 155-157 to a vacuum. In the first scenario, the chosen one of precursors 120 and 121 is used to deposit a film on a substrate (not shown) located within deposition chamber 160. Additional co-reactant and inert gases are generally part of a CVD or ALD process. These are not shown but are delivered using conventional hardware including mass flow controllers (MFCs) and pressure controllers (PCs). In an atomic layer deposition (ALD) process, the delivery of the co-reactant gas is separated in time from the delivery of the precursor vapor. An optional carrier gas supply 170 can be used to transport precursors 120 and 121 within process system 150, while a programmable logic controller 175 controls process system 150. More specifically, controller 175 is connected through control lines 176 and 177 to gauge 161 and control valve 197 and is able to measure and control pressure in chamber 160 by opening valve 197, which leads to vacuum 198. A purge gas supplied by a purge gas supply 180 is used to purge run/refill chambers 155-157.

In one embodiment, each of run/refill chambers 155-157 is sized to hold an amount of precursor 120 or 121 sufficient for one deposition cycle but not two deposition cycles. In other embodiments, each of run/refill chambers 155-157 is sized to hold an amount of precursor 120 or 121 sufficient for a plurality of deposition cycles. For purposes of the present invention, the term "deposition cycle" refers to the steps by which a single layer of a precursor is deposited on a substrate. Although run/refill chambers 155-157 are labeled with different reference numerals, run/refill chambers 155-157 can be identical to one another.

For purposes of the present invention, the term "run/refill" means "run and/or refill". A chamber (e.g., chamber 155) is being refilled when it is at its lower temperature setting and vapor is entering via vapor supply line 105 and condensing on the high surface area interior. Then, the chamber is running when it is at its higher temperature setting and the solid that had condensed during the refill part of the cycle is evaporated and the vapor is delivered to the deposition chamber via a line (not labeled). In other words, the term "run/refill chamber" indicates that the chamber acts as both run and refill chambers. The run/refill chamber can incorporate filtration, purification, pressure/vacuum monitoring and delivery rate or solids film sensing. The run/refill chamber is preferably designed to be cycled for every wafer, or one "refill" of the run/refill chamber is designed to provide vapor for two or more wafers before getting "refilled" again.

Figure 2:
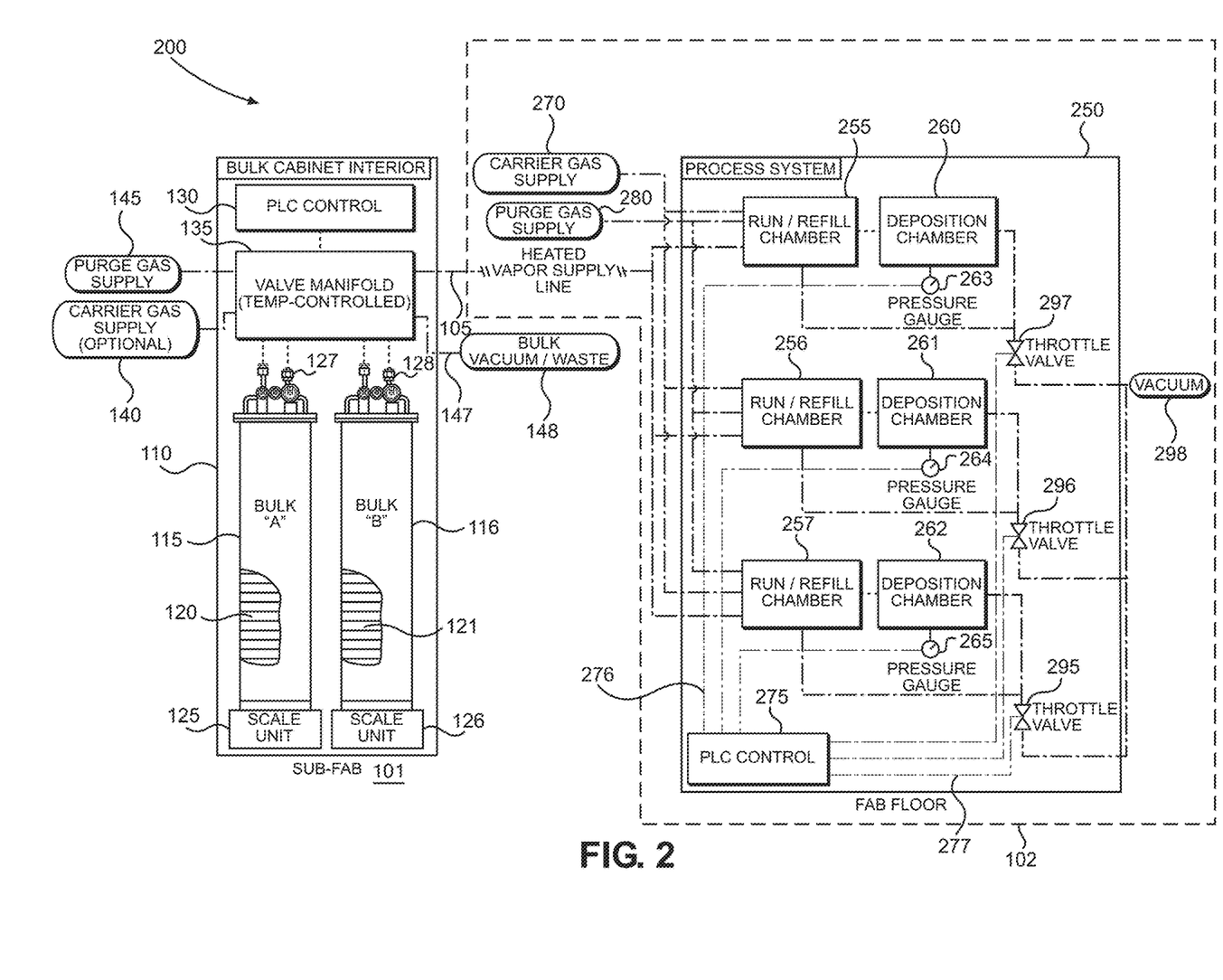
FIG. 2 is a schematic view of a second CVD system constructed in accordance with the present invention.

With reference now to FIG. 2, there is shown a CVD system 200 constructed in accordance with the present invention. CVD system 200 generally functions in the same manner as CVD system 100 except that CVD system 200 has one run/refill chamber per deposition chamber. Specifically, a process system 250 includes a plurality of run/refill chambers 255-257, which receive precursors 120 and 121 from vapor supply line 105. Precursors 120 and 121 enter run/refill chambers 255-257 as a vapor and are then deposited within run/refill chambers 255-257 as a solid by cooling run/refill chambers 255-257. When needed, precursor 120 or 121 is sublimated within one of run/refill chambers 255-257 by heating that run/refill chamber 255-257. Precursor 120 or 121 is then transported to a corresponding one of a plurality of deposition chambers 260-262. Precursor 120 or 121 is used to deposit a film on a substrate (not shown) located within the corresponding deposition chamber 260-262. An optional carrier gas supply 270 can be used to transport precursors 120 and 121 within process system 250, while a controller 275 controls process system 250. More specifically, controller 275 is connected to gauges 263-265 through control lines 276. Controller 275 is also connected through lines 277 to control valves 295-297 and is able to measure and control pressure in chambers 260-262 by opening valves 295-297, which lead to vacuum 298. A purge gas supplied by a purge gas supply 280 is used to purge run/refill chambers 255-257.

Figure 3:
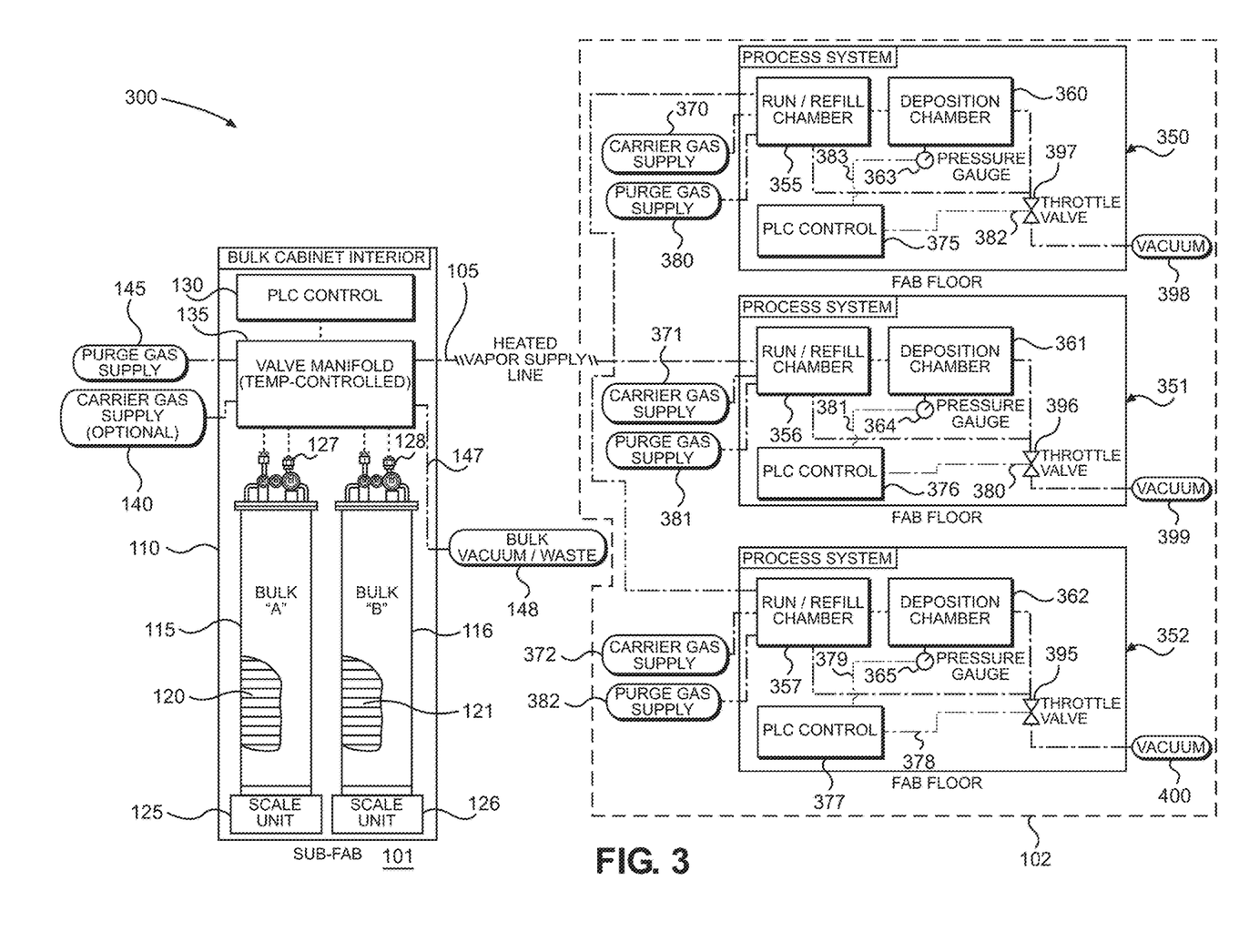
FIG. 3 is a schematic view of a third CVD system constructed in accordance with the present invention.

FIG. 3 shows a CVD system 300 constructed in accordance with the present invention. CVD system 300 generally functions in the same manner as CVD systems 100 and 200 except that CVD system 300 includes a plurality of process systems 350-352. Each process system 350-352 includes a run/refill chamber 355-357, which receives precursors 120 and 121 from vapor supply line 105. Precursors 120 and 121 enter run/refill chambers 355-357 as a vapor and are then deposited within run/refill chambers 355-357 as a solid by cooling run/refill chambers 355-357. When needed, precursor 120 or 121 is sublimated within one of run/refill chambers 355-357 by heating that run/refill chamber 355-357. Precursor 120 or 121 is then transported to a corresponding deposition chamber 360-362. Precursor 120 or 121 is used to deposit a film on a substrate (not shown) located within that deposition chamber 360-362. Optional carrier gas supplies 370-372 can be used to transport precursors 120 and 121 within process systems 350-352, while controllers 375-377 control process systems 350-352. More specifically, controllers 375-377 are connected to gauges 363-365 through control lines of which lines 378-383 are labeled. Controllers 375-377 are also connected to control valves 395-397 and are able to measure and control pressure in chambers 360-362 by opening valves 395-397, which lead to vacuum at 398-400. A purge gas supplied by purge gas supplies 380-382 is used to purge run/refill chambers 355-357.

Figure 4:
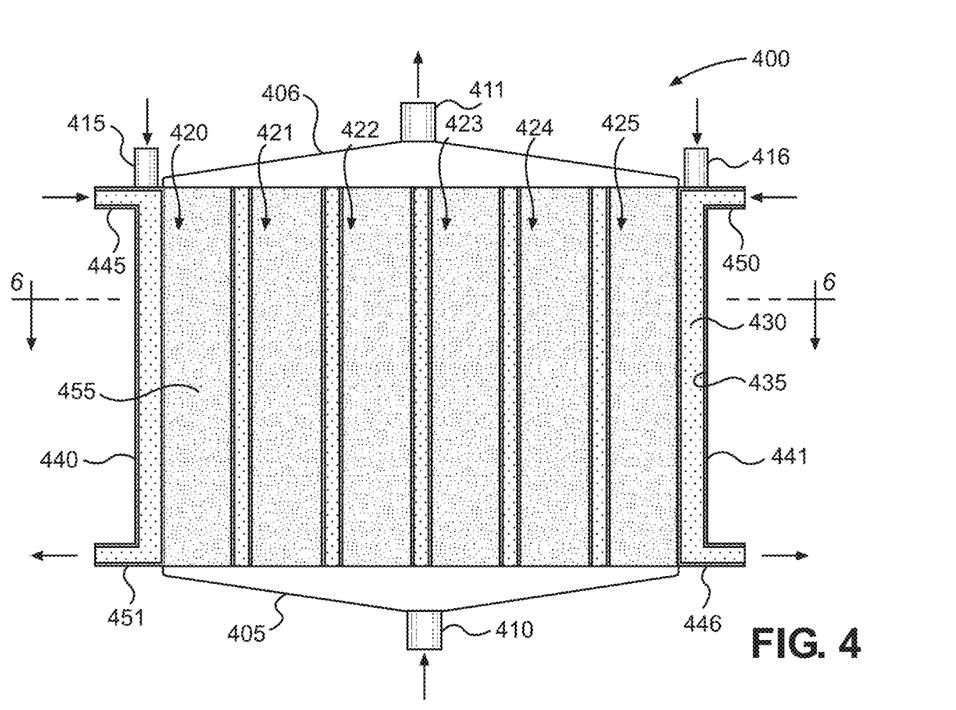
FIG. 4 is a side cross section of a first run/refill chamber constructed in accordance with the present invention.

Turning to FIG. 4, a cross section of a run/refill chamber 400 constructed in accordance with the present invention is provided. Run/refill chamber 400 includes manifolds 405 and 406. A precursor (not shown) enters run/refill chamber 400 as a vapor through an inlet 410, which is connected to manifold 405. Inlet 410 would also be connected to a vapor supply line, such as vapor supply line 105 (not shown). The precursor exits run/refill chamber 400 as a vapor through an outlet 411, which is connected to manifold 406. Outlet 411 would also be connected to a deposition chamber, such as deposition chamber 160, via a second conduit (as shown in FIG. 1, for example). Purge gas and carrier gas can enter run/refill chamber 400 through manifold 405, although the inlets are not visible. Run/refill chamber 400 also includes a plurality of tubes 420-425 in which the precursor is stored. Specifically, the precursor passes through inlet 410 and manifold 405 as a vapor and is condensed within tubes 420-425 as a solid. To accomplish this phase change, tubes 420-425 are chilled using a heat transfer fluid 430, which is located in a chamber 435 that surrounds tubes 420-425. Heat transfer fluid 430 can be a liquid or a gas. Chamber 435 is defined, at least in part, by sidewalls 440 and 441 of run/refill chamber 400. Heat transfer fluid 430 enters chamber 435 through an inlet 445 and exits chamber 435 through an outlet 446. When it is desired to sublimate the precursor, tubes 420-425 are heated using another heat transfer fluid (not shown), which enters chamber 435 through an inlet 450 and exits chamber 435 through an outlet 451. Displacement gas, such as nitrogen gas ($N_2$) or clean dry air (CDA), can be used to separate the two temperatures of heat transfer fluid. Displacement gas enters chamber 435 through an inlet 415 and exits chamber 435 through an outlet 416. Preferably, tubes 420-425 are filled with a foam 455 that is chemically compatible with the precursor being used. For example, foam 455 can be a nickel foam, an aluminum foam or a graphite foam. Foam 455 also has a high surface area and a high heat transfer rate, which helps with deposition and sublimation of the precursor.

While run/refill chamber 400 is described as being heated and cooled using heat transfer fluids, run/refill chambers constructed in accordance with the present invention can be heated and cooled by other means. For example, resistive heating elements and Peltier devices can be used. Also, other media that increases the surface area, such as beads or Raschig rings, can be used in place of foam 455.

Figure 5:
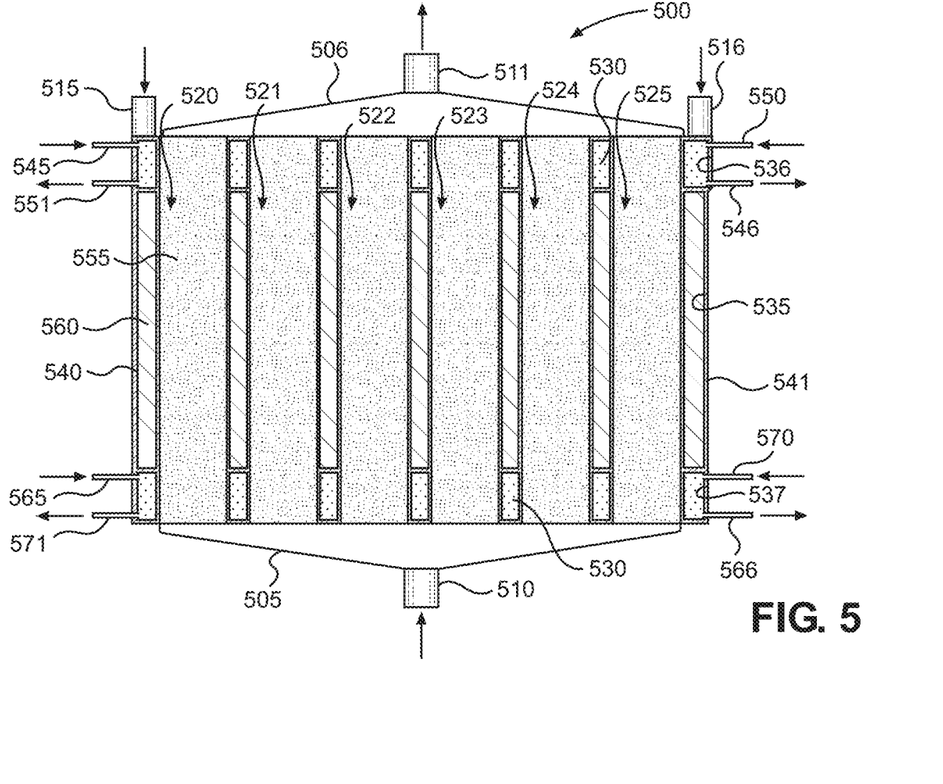
FIG. 5 is a side cross section of a second run/refill chamber constructed in accordance with the present invention.

With reference now to FIG. 5, a cross section of a run/refill chamber 500 constructed in accordance with the present invention is provided. Run/refill chamber 500 includes manifolds 505 and 506. A precursor (not shown)

enters run/refill chamber 500 through an inlet 510, which is connected to manifold 505. Inlet 510 would also be connected to a vapor supply line, such as vapor supply line 105 (not shown). The precursor exits run/refill chamber 500 through an outlet 511, which is connected to manifold 506. Outlet 511 would also be connected to a deposition chamber, such as deposition chamber 160, via a conduit (not shown). Purge gas and carrier gas can enter run/refill chamber 500 through manifold 505, although the inlets are not visible. Run/refill chamber 500 also includes a plurality of tubes 520-525 in which the precursor is stored. Specifically, the precursor passes through inlet 510 and manifold 505 as a vapor and is deposited within tubes 520-525 as a solid. Preferably, tubes 520-525 are filled with a foam 555 that is chemically compatible with the precursor being used. For example, foam 555 can be a nickel foam, an aluminum foam or a graphite foam. Foam 555 also has a high surface area and a high heat transfer rate, which helps with deposition and sublimation of the precursor.

Run/refill chamber 500 generally functions in the same manner as run/refill chamber 400 except that a temperature differential or gradient is provided along the length of tubes 520-525 to prevent excessive buildup of the precursor at the ends of tubes 520-525 nearest inlet 510. In particular, this is accomplished by surrounding the central portions of tubes 520-525 with insulation 560, while setting up a temperature difference between the inlet and outlet ends of tubes 520-525 by using a heat transfer fluid 530 at two different temperatures. Specifically, during the refill or condensation part of the cycle, the ends of tubes 520-525 toward inlet 510 are maintained at a higher temperature than the ends of tubes 520-525 toward outlet 511. Insulation 560 is located in a first chamber 535, which is defined, at least in part, by sidewalls 540 and 541 of run/refill chamber 500. Heat transfer fluid 530 is located in a second chamber 536, which surrounds the ends of tubes 520-525 nearest inlet 510, and a third chamber 537, which surrounds the ends of tubes 520-525 nearest outlet 511. Chambers 536 and 537 are also defined, at least in part, by sidewalls 540 and 541. Heat transfer fluid 530 enters second chamber 536 through an inlet 545 and exits second chamber 536 through an outlet 546. Similarly, heat transfer fluid 530 enters third chamber 537 through an inlet 565 and exits third chamber 537 through an outlet 566. When it is desired to sublimate the precursor, tubes 520-525 are heated using another heat transfer fluid (not shown), which enters second chamber 536 through an inlet 550 and exits second chamber 536 through an outlet 551. This other heat transfer fluid also enters third chamber 537 through an inlet 570 and exits third chamber 537 through an outlet 571.

Preferably, the portion of the heat transfer fluid sent to second chamber 536 is not at the same temperature as the portion of the heat transfer fluid sent to third chamber 537. This can be accomplished by providing additional heating or cooling to one portion of the heat transfer fluid, for example. Alternatively, rather than sending the same heat transfer fluid to both second chamber 536 and third chamber 537, different heat transfer fluids can be sent to second chamber 536 and third chamber 537. In either case, the result is independent temperature control, which allows for more uniform condensation and sublimation along the length of tubes 520-525. For example, during deposition, the heat transfer fluid in second chamber 536 can be relatively colder than the heat transfer fluid in third chamber 537. During sublimation, the heat transfer fluid in second chamber 536 can be relatively warmer than the heat transfer fluid in third chamber 537.

Figure 6:
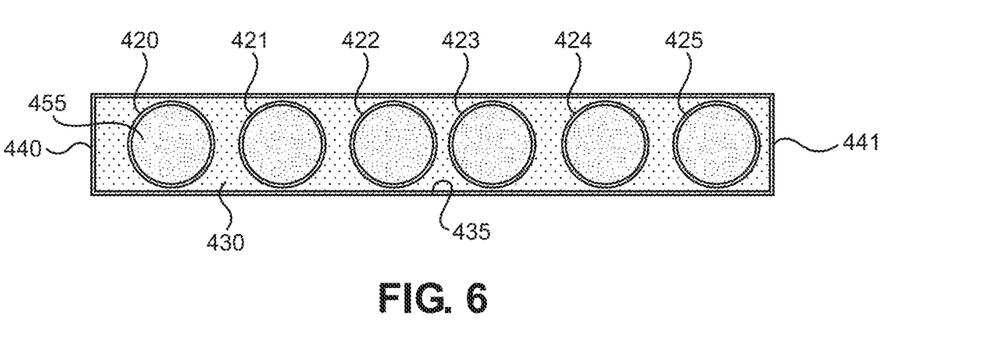
FIG. 6 is a top cross section of the first run/refill chamber.
Figure 7:
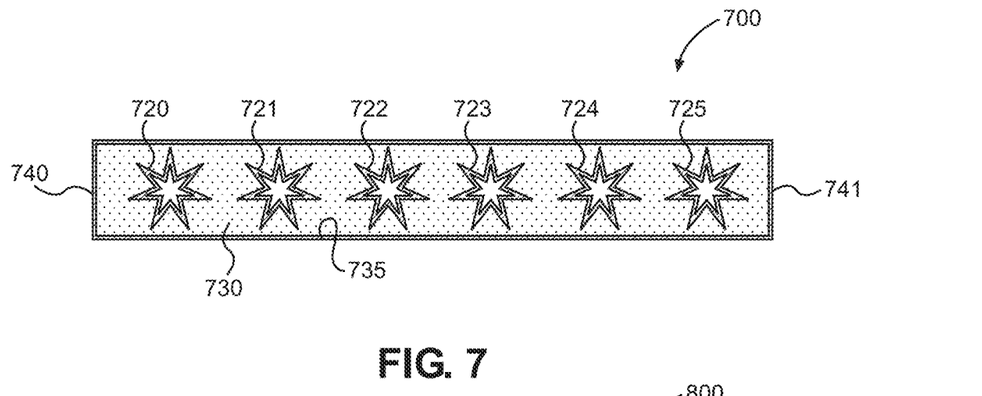
FIG. 7 is a top cross section of a third run/refill chamber constructed in accordance with the present invention.

Turning to FIG. 6, another cross section of run/refill chamber 400 is provided. This view highlights the shape of tubes 420-425 and chamber 435. Specifically, each of tubes 420-425 has a circular cross section. However, other arrangements can be used in run/refill chambers constructed in accordance with the present invention. For example, FIG. 7 shows a run/refill chamber 700 including a plurality of tubes 720-725, each having a star-shaped cross section. The use of a star-shaped cross section rather than a circular cross section provides more surface area for condensation and sublimation as well as for heat transfer. For completeness, a heat transfer fluid 730, a chamber 735 and sidewalls 740 and 741 are also labeled in FIG. 7.

Figure 8:
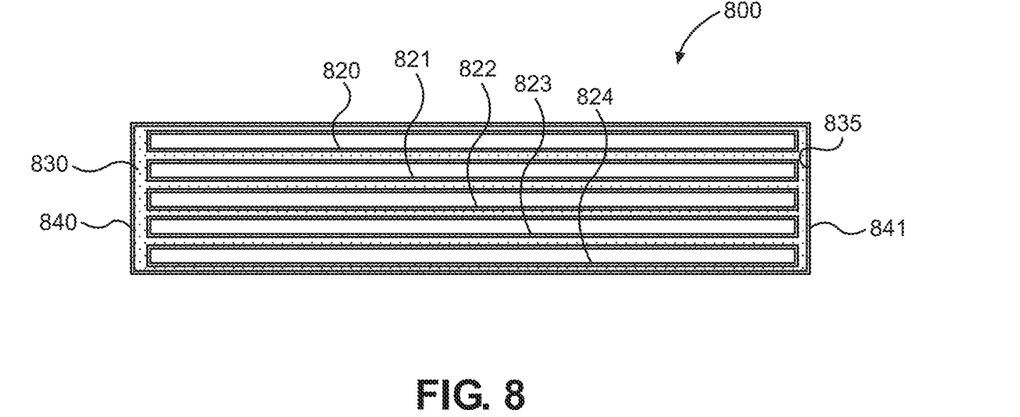
FIG. 8 is a top cross section of a fourth run/refill chamber constructed in accordance with the present invention.

FIG. 8 shows another tube arrangement for a run/refill chamber constructed in accordance with the present invention. In particular, a run/refill chamber 800 includes tubes 820-824, which have rectangular cross sections. Each of tubes 820-824 is relatively thin to provide more surface area. As with the other embodiments, tubes 820-824 have their temperature controlled using a heat transfer fluid 830 that is located in a chamber 835 defined, at least in part, by sidewalls 840 and 841.

While certain exemplary tube arrangements have been described, it should be recognized that there are a variety of different ways to increase the surface area available within the tubes of a run/refill chamber. For example, the tubes can include fins.

In addition to the detailed description provided above, operation of a run/refill chamber of the present invention can be understood using the following general example. With the run/refill chamber at a temperature T1, a vapor/carrier gas mixture is delivered into the run/refill chamber inlet from a heated vapor supply line. As the mixed gas flows through the tubes of the run/refill chamber, solid precursor is condensed onto the interior surface of the tubes. This can be either the tube itself or the foam filler surface. Carrier gas is pulled through the run/refill chamber outlet to vacuum. This step is timed to provide the desired load of solid precursor on the interior of the run/refill chamber. Optionally, the inlet flow can be shut off while residual carrier gas is pumped to vacuum. Next, the run/refill chamber is heated to a temperature T2. Carrier gas is flowed into the inlet of the run/refill chamber, the solid precursor is sublimated, and the vapor is carried to a deposition chamber. At the end of the cycle, the outlet of the run/refill chamber is isolated from the deposition chamber, and the run/refill chamber is cooled to temperature T1. The cycle is repeated as needed. This kind of operation cycle can be repeated for each wafer deposition, for each pulse of an ALD deposition or with any period that works well for a particular manufacturing situation.

In another example, the run/refill chamber is evacuated at temperature T1. Next vapor is delivered from the heated vapor supply line, and solid precursor is condensed in the run/refill chamber. This step is timed to provide the desired load of solid precursor on the interior of the run/refill chamber. Next, the supply to the run/refill chamber is turned off, and the chamber is heated to temperature T2. Carrier gas is flowed into the inlet of the run/refill chamber, the solid precursor is sublimated, and the vapor is carried to the deposition chamber. At the end of the cycle, the outlet of the run/refill chamber is isolated from the deposition chamber, and the chamber is cooled to temperature T1. The cycle is repeated as needed.

Temperature control of a run/refill chamber of the present invention can be understood using the following general example. With the starting state of the run/refill chamber at a temperature T2, heat transfer fluid at temperature T2 is flowing into a T2 supply and out of a T2 return to a reservoir that holds the heat transfer fluid at temperature T2. When a quick change of temperature to a temperature T1 is desired, the T2 supply is shut off, and displacement gas pushes the heat transfer fluid at temperature T2 to the T2 return. When most or enough of the heat transfer fluid at temperature T2 is removed, the T2 return is also shut off, a T1 supply is turned on, and the displacement gas is allowed to flow freely back out. When the chamber is filled with a heat transfer fluid at a temperature T1, the displacement gas return is shut off, and a T1 return allows the heat transfer fluid at temperature T1 to return to a reservoir that holds the heat transfer fluid at temperature T1. The heat transfer fluid at temperature T1 continues to flow through the run/refill chamber for the deposition part of the operation cycle. When the temperature of the run/refill chamber needs to be increased again to temperature T2, a similar sequence is performed. The T1 supply is shut off, and displacement gas pushes the heat transfer fluid at temperature T1 to the T1 return. When most or enough of the heat transfer fluid at temperature T1 is removed, the T1 return is also shut off, the T2 supply is turned on, and the displacement gas is allowed to flow freely back out. When the chamber is filled with the heat transfer fluid at temperature T2, the displacement gas return is shut off, and the T2 return allows the heat transfer fluid at temperature T2 to return to the reservoir that holds the heat transfer fluid at temperature T2. The heat transfer fluid at temperature T2 continues to flow through the run/refill chamber for the sublimation part of the operation cycle.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. Specifically, the invention provides a chemical delivery system that efficiently, effectively and consistently delivers a solid precursor in a CVD process while minimizing downtime of the CVD system and the amount of space taken up near a process tool. It will be understood, however, that this disclosure is, in many respects, only illustrative. Changes may be made in details, particularly in matters of shape, size, and arrangement of parts without exceeding the scope of the disclosure. For example, the bulk containers can contain a low vapor pressure liquid or a solid that is melted in the bulk container to optimize vapor delivery or refill of the bulk container. The disclosure's scope is, of course, defined in the language in which the appended claims are expressed.

What is claimed is:

1. A chemical delivery system comprising:
   at least one bulk container configured to store a precursor;
   at least one run/refill chamber comprising a plurality of spaced apart tubes to receive the precursor in vapor form and store the precursor in solid form, the spaced apart tubes surrounded by heat transfer fluid;
   at least one deposition chamber to receive sublimed precursor from the run/refill chamber(s);
   a first conduit connecting the bulk container to the run/refill chamber(s) for transporting the precursor from the bulk container to the run/refill chamber(s) in vapor form; and
   a second conduit for transporting sublimed precursor from the run/refill chamber(s) to the deposition chamber(s) in vapor form.

2. The chemical delivery system of claim 1, wherein the bulk container is configured to store the precursor in solid form and to be heated to sublimate the precursor.

3. The chemical delivery system of claim 1, wherein the first conduit and the second conduit are configured to be heated.

4. The chemical delivery system of claim 1, wherein the run/refill chamber(s) are located in a fabrication area, and the bulk container is located outside the fabrication area.

5. The chemical delivery system of claim 1, wherein each of the plurality of spaced apart tubes has a circular cross section, a rectangular cross section, or a star-shaped cross section.

6. The chemical delivery system of claim 1, wherein each of the plurality of spaced apart tubes is filled with a foam.

* * * * *